United States Patent [19]

Goeke

[11] Patent Number: 5,200,752
[45] Date of Patent: Apr. 6, 1993

[54] INTEGRATING ANALOG TO DIGITAL CONVERTER RUN-UP METHOD AND SYSTEM

[75] Inventor: Wayne C. Goeke, Fort Collins, Colo.

[73] Assignee: Hewlett-Packard Company, Palo Alto, Calif.

[21] Appl. No.: 732,382

[22] Filed: Jul. 18, 1991

[51] Int. Cl.$^5$ ............................................. H03M 1/50
[52] U.S. Cl. ..................................... 341/168; 341/166
[58] Field of Search ............... 341/155, 166, 167, 168, 341/169, 170, 127, 128, 129

[56] References Cited

U.S. PATENT DOCUMENTS

| | | | |
|---|---|---|---|
| 4,034,364 | 7/1977 | Kukuda et al. | 341/168 |
| 4,357,600 | 11/1982 | Ressmeyer et al. | 341/168 |
| 4,857,933 | 8/1989 | Knight | 341/168 |
| 4,951,053 | 8/1990 | DesJardin et al. | 341/136 |

Primary Examiner—A. D. Pellinen
Assistant Examiner—Brian K. Young

[57] ABSTRACT

A multislope A/D converter is presented which employs a multislope integration technique enabling the use of a single comparator to detect polarity changes in the integrator output voltage. The run-up interval of the integrating A/D converter is controlled by a four-step pattern that is repeated as many times as is required in order to keep the integrator output voltage within the confines of a preselected voltage range. During the first step of the four-step pattern, a positive reference charge is applied to the integrator. In the second step, a decision is made as to whether to either maintain the application of the positive reference charge to the integrator or to change over to the negative reference charge. The decision is determined such that the reference charge causes the integrator output voltage to move toward or through a preselected target voltage range. The third step is to either connect the negative reference charge to the integrator or to maintain the application of the negative reference charge. The fourth step is to decide whether to either leave the negative reference charge connected or to switch back to the positive reference charge. The preceding decision is decided such that the reference charge causes the integrator output voltage to move toward or through the preselected target voltage range. The time duration for each step can be equal or different depending on the requirements of the A/D converter.

12 Claims, 14 Drawing Sheets

INTEGRATING ANALOG TO DIGITAL CONVERTER RUN-UP METHOD AND SYSTEM

BACKGROUND OF THE INVENTION

I. Field of the Invention

The present invention relates to the digital measurement of an unknown input voltage and, more particularly, to a method and system for controlling the run-up (RU) portion of an integrating analog-to-digital (A/D) converter.

II. Related Art

Figure 1:
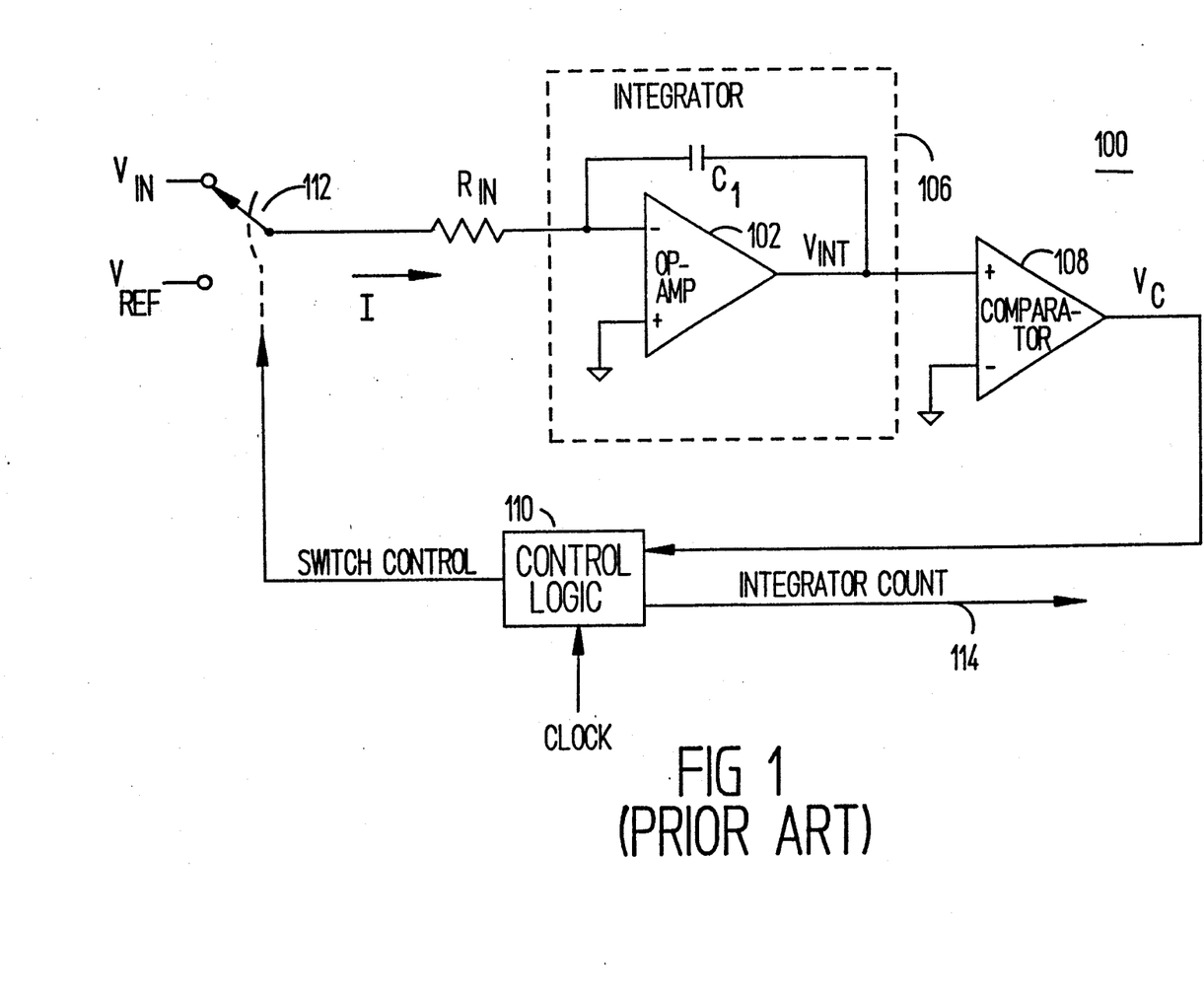
FIG. 1 is a block diagram of a conventional integrating A/D converter for converting an input voltage $V_{IN}$ into a digitized signal, called an integrator count.

A conventional integrating A/D converter is illustrated in FIG. 1. Generally, the integrating A/D converter converts an analog input voltage $V_{IN}$ into a digital signal, or an "integrator count." An operational amplifier (OP-AMP) 102 in combination with a capacitor $C_1$ constitute an integrator 106. The integrator 106 receives the analog input voltage $V_{IN}$ and provides an output voltage $V_{INT}$ to a comparator 108. The comparator 108 compares $V_{INT}$ to a reference voltage, which oftentimes is ground, as shown in FIG. 1. The comparator 108 then feeds a comparator output voltage $V_C$ to control logic 110, which in turn controls a switch 112. The switch 112 can be controlled to provide either the input voltage $V_{IN}$ or a reference voltage $V_{REF}$ at any given instance. The reference voltage $V_{REF}$ can be positive or negative. The control logic 110 provides the integrator count, as indicated at a line 114.

Figure 2:
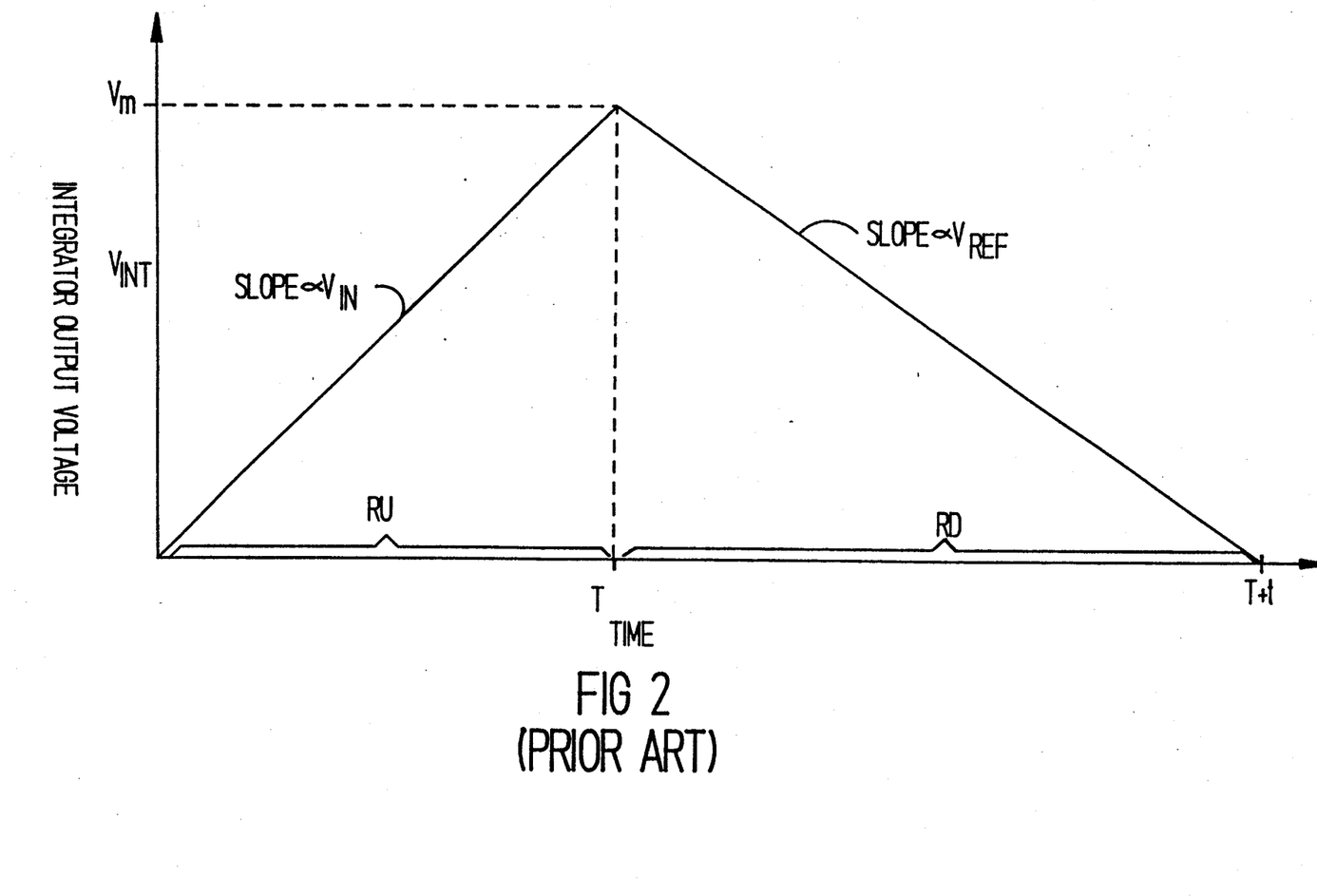
FIG. 2 is a plot of an integrator output voltage $V_{INT}$ as a function of time illustrating the conventional technique of dual slope integration.

In conventional dual slope integration, the input voltage $V_{IN}$ is applied to the input of the integrator 106 for a run-up (RU) interval of duration T, as indicated in FIG. 2. Moreover, a reference discharging voltage $V_{REF}$ is then applied to the integrator input during a run-down (RD) interval. The RD interval ends when the capacitor $C_1$ is totally discharged. The duration t of the RD interval is measured, and the value of the input voltage $V_{IN}$ is calculated as follows: $V_{IN} = t^*(V_{REF}/T)$.

Integrating A/D converters are desirable because they essentially average the analog voltage over a short time period to provide a digital representation. In effect, the integrating A/D converter cancels or reduces noise during the period T.

The value of duration t is typically measured by counting (usually synchronous with the clock) during the RD interval. For a given counter rate, the sensitivity of the A/D converter increases with a decrease in the rate at which the discharge occurs. Therefore, sensitivity can be increased by decreasing the magnitude of $V_{REF}$. However, the decreasing of $V_{REF}$ results in a slower response of the circuit, which is impractical in many instances.

The sensitivity can also be increased by increasing the maximum voltage $V_m$ of the integrator output voltage $V_{INT}$ for a fixed duration of the RU interval. An increase in $V_m$ is achieved by reducing the value of the input resistance $R_{IN}$ to increase the slope of the integrator output voltage $V_{INT}$ during the RU interval. However, for an OP-AMP integrator 106, the integrator output voltage $V_{INT}$ must be within the bounds of the OP-AMP power supply voltage limits.

Figure 3:
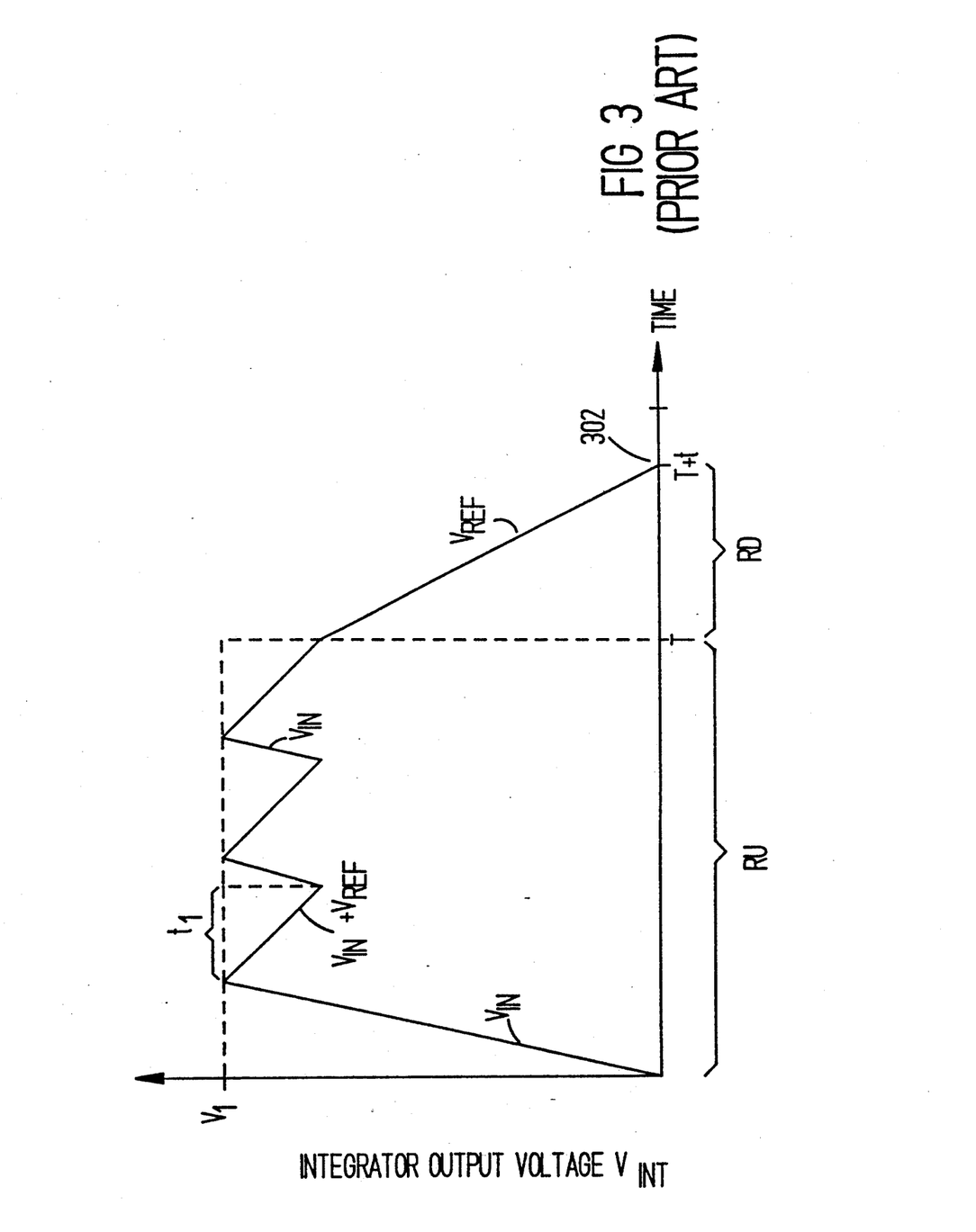
FIG. 3 is a plot of an integrator output voltage $V_{INT}$ as a function of time illustrating a conventional modification of the dual slope integration technique.

As illustrated in FIG. 3, a large (steep) slope during the RU interval can be employed without exceeding the voltage of the power supply by imposing a saw-toothed response during the RU interval. Whenever the integrator output voltage $V_{INT}$ is detected as approaching a voltage $V_1$, the reference voltage $V_{REF}$ (negative in the graphical case shown) is applied to the integrator 106 along with the input voltage $V_{IN}$ for several intervals of duration $t_1$. The reference voltage $V_{REF}$ serves to slightly discharge $V_{INT}$. The integrator output voltage $V_{INT}$ therefore has a slope proportional to $V_{IN} + V_{REF}$ during such discharging intervals. The discharging intervals can be repeated as necessary to maintain the integrator output voltage $V_{INT}$ below the voltage $V_1$. The total time $t_3$ during which $V_{REF}$ is applied, which is equal to the sum of the discharging intervals having duration $t_1$, is measured for use in calculating the unknown input voltage $V_{IN}$. As indicated in FIG. 3, the magnitude of the input voltage $V_{IN}$ is calculated as follows:

$$V_{IN} = (t_3 * V_{REF} + t_2 * V_{REF})/T, \text{ where } t_3 = \{t_1\}$$

Figure 4:
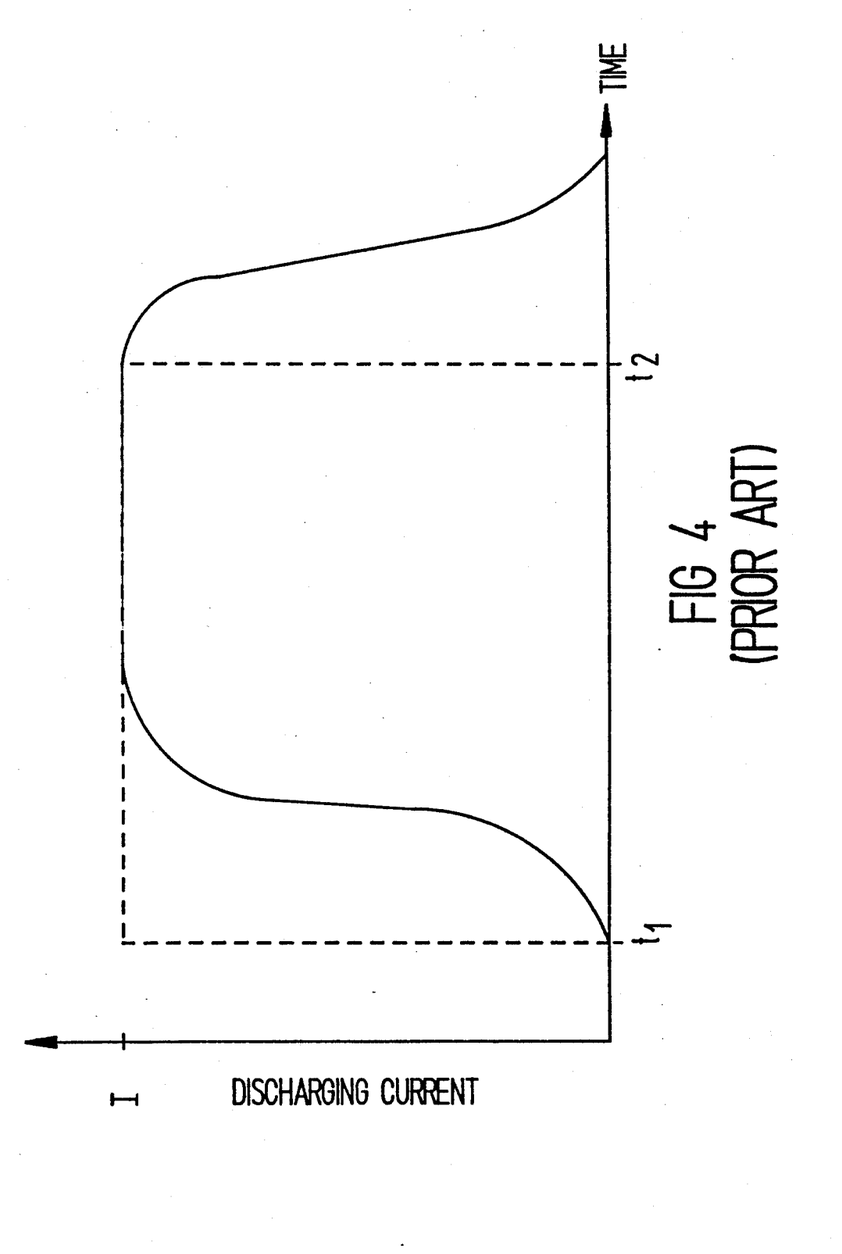
FIG. 4 is a plot of current I applied to the integrator versus time illustrating the response characteristics of a typical switch, such as that shown in FIG. 1.

The discharging technique illustrated in FIG. 3 produces a multiplicative error due to switch time mismatch errors. These switch time mismatch errors are discussed in regard to FIG. 4. FIG. 4 illustrates the switching characteristics for a typical switch, for example, the switch 112, which is used to selectively couple the reference voltage $V_{REF}$ into the A/D converter. The ideal switching curve for a switch turned on at a time $t_1$ and turned off at a time $t_2$ is indicated by the dotted curve in FIG. 4. The solid curve shows the actual switch response in the real world. Because the turning-on and turning-off characteristics are typically not symmetric, the total ideal charge transfer proportional to the reference voltage $V_{REF}^*(t_2 - t_1)$ will not equal the actual charge transfer. Because of the switching time mismatches, the switch is effectively held open for an additional switching mismatched time $\Delta t$ ($\Delta t$ can be positive or negative), thereby transferring a charge proportional to $V_{REF}^*(t_2 - t_1 - \Delta t)$. In a switching scheme such as that shown in FIG. 3, where the number and switch activations is proportional to the magnitude of the input voltage $V_{IN}$, such mismatch of switching times will produce an error in the A/D conversion proportional to $n^*\Delta t$. The integer n is an integer valued step function increasing with the increase in the magnitude of the input voltage $V_{IN}$ and representing a coarse valuation of the input voltage $V_{IN}$. The switching time mismatch error results in a multiplicative error in this coarse valuation of $V_{IN}$.

To correct for this error, the A/D converter requires a scaling factor which adjusts the measured results before output of the digital result. Such adjustment requires the measurement of a known reference voltage to set the scaling factor, and then each subsequent measurement requires a multiplication of the coarse valuation of this scaling factor. Since subtractions are more easily and rapidly executed than multiplications, it would be advantageous to convert switched time mismatched scaling errors into offset errors which can be eliminated by subtraction.

Figure 5:
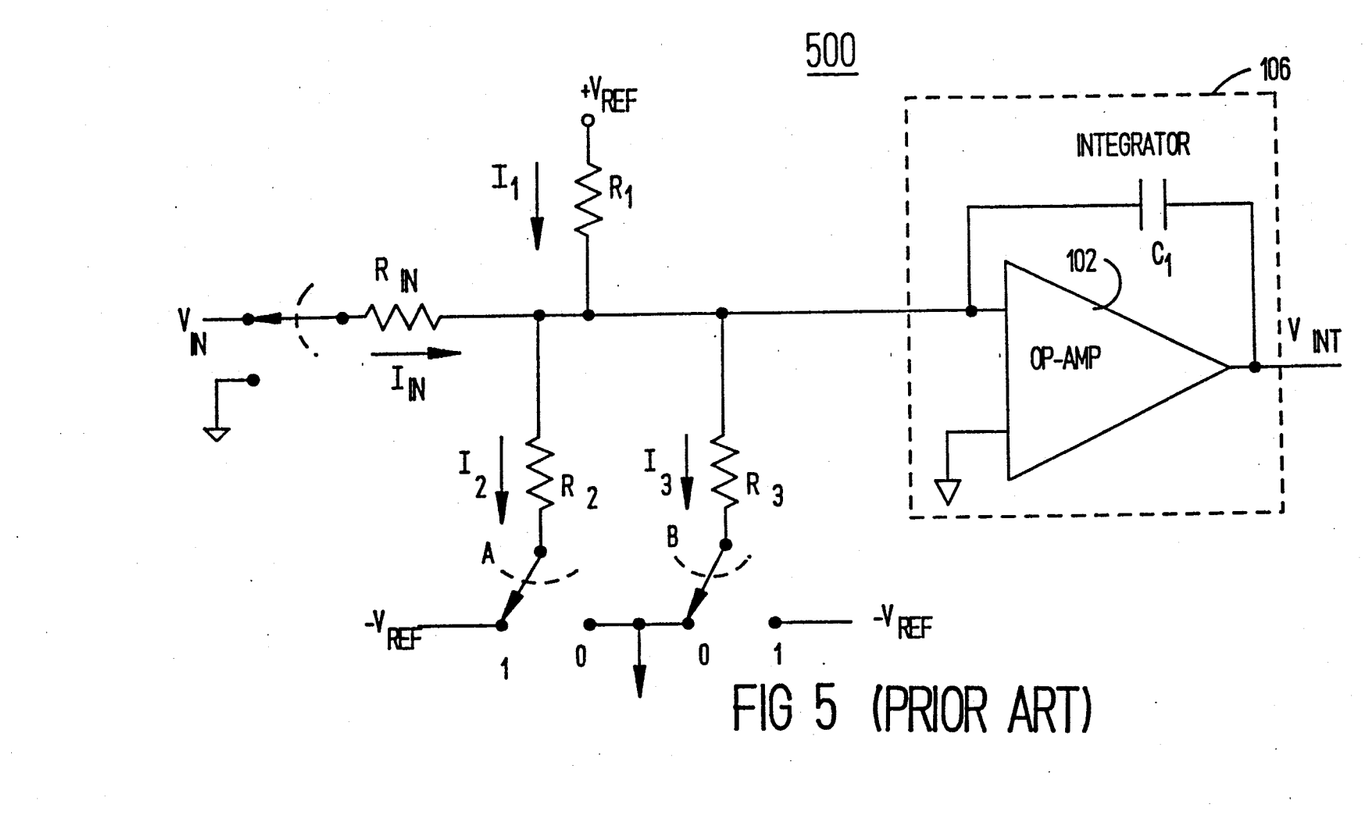
FIG. 5 illustrates a block diagram of an integrating A/D converter wherein a positive reference voltage $+V_{REF}$, a negative reference voltage $-V_{REF}$, or neither reference voltage is applied to the input voltage $V_{IN}$ by control switches A and B.

U.S. Pat. No. 4,357,600 to Ressmeyer, which is incorporated herein by reference, discloses a multislope A/D converter for producing a digital indication of an input voltage. FIG. 5 substantially represents the embodiment taught by the Ressmeyer patent. In the Ressmeyer embodiment, positive and negative reference voltages $V_{REF}$ are selectively applied in order to maintain the integrator output voltage $V_{INT}$ within a particular voltage range, such as the bounds of the integrator power supply voltages (positive and negative).

As shown in FIG. 5, a positive reference voltage $+V_{REF}$ is continuously supplied to the A/D converter, while the negative reference voltage $-V_{REF}$ is supplied in accordance with the states of switches A and B. Effectively, the input voltage $V_{IN}$ can pass through to the integrator 106 unaffected, or can be manipulated by the positive reference voltage $+V_{REF}$ or the negative reference voltage $-V_{REF}$. Specifically, when switch A connects ("1") the negative reference voltage $-V_{REF}$ to the A/D converter while the switch B disconnects ("0") the negative reference voltage $-V_{REF}$, as shown in FIG. 5, the result is that the input voltage $V_{IN}$ enters the integrator 106 substantially unaffected. In other words, the current $I_2$ cancels the current $I_1$, while the current $I_3$ approximately equals zero. The same circuit scenario ensues when switch A equals zero and switch B equals 1.

Moreover, in order to apply the positive reference voltage $+V_{REF}$, both switches A and B are set to zero. Finally, to apply the negative reference voltage $-V_{REF}$ to the input voltage $V_{IN}$, both switches A and B are set to 1.

The Ressmeyer patent teaches a four-step pattern, which is repeated as many times as is required, during the RU interval of the integrating A/D converter. The four-step pattern is set forth in Table A below.

TABLE A

| Step | Reference Voltage Bias to $V_{IN}$ | State of Switch A | State of Switch B | Origin of Switch States |
|---|---|---|---|---|
| 1 | zero | 0 | 1 | forced |
| 2 | +/− | 0(1) | 0(1) | comparator driven |
| 3 | zero | 1 | 0 | forced |
| 4 | +/− | 0(1) | 0(1) | comparator driven |

As indicated in Table A, the first step is to permit the input voltage to enter the integrator 106 unaffected. The foregoing state is forced by the switches A and B, irrespective of the integrator output voltage $V_{INT}$. The second step envisions applying either the positive reference voltage $+V_{REF}$ or the negative reference voltage $-V_{REF}$ to the input voltage. The second step is driven, or forced, by the comparator 108. Essentially, if the integrator output voltage $V_{INT}$ is at a positive voltage, the comparator 108 causes the control logic to apply the negative reference voltage $-V_{REF}$. Conversely, if the integrator output voltage $V_{INT}$ is negative, the comparator 108 causes the control logic to apply the positive reference voltage $+V_{REF}$.

In step 3, as shown in Table A, the input voltage $V_{IN}$ is again permitted to reach the integrator 106 unaffected. This step is forced by the control logic without regard to the integrator output voltage $V_{INT}$. Finally, in step 4 of the four-step pattern, the input voltage $V_{IN}$ is affected by either the positive reference voltage $+V_{REF}$ or the negative reference voltage $-V_{REF}$, depending upon the integrator output voltage $V_{INT}$. In other words, the fourth step, just as the second step, is forced by the comparator 108.

Figure 6:
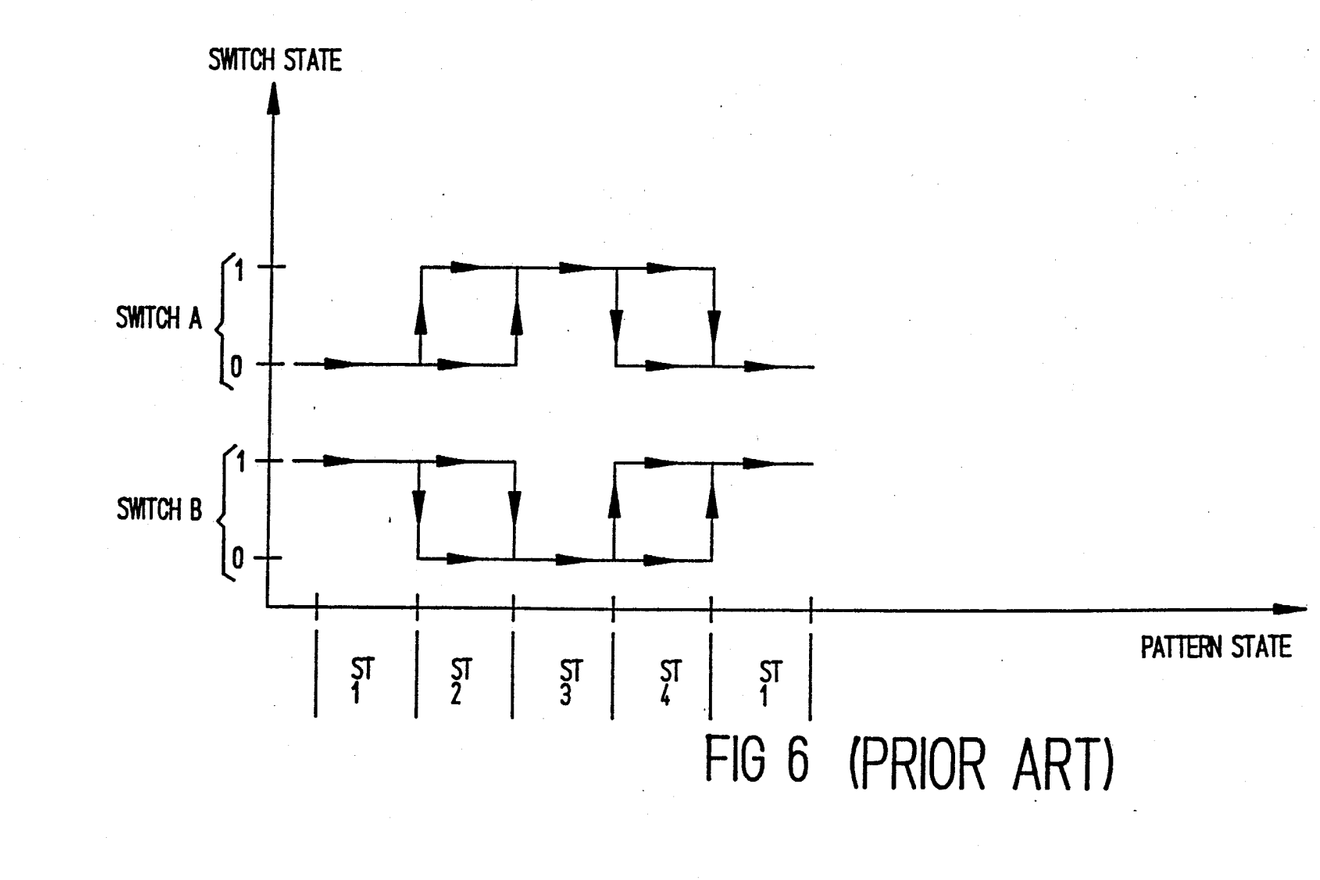
FIG. 6 is a plot of switch state versus pattern state in regard to FIG. 5.

FIG. 6 is a plot of a switch state versus pattern state in regard to FIG. 5. Essentially, FIG. 6 is a graphical representation of Table A above.

The four-step pattern disclosed by U.S. Pat. No. 4,357,600 has advantages. The repetition of the pattern can be used to confine any input voltage $V_{IN}$ within the bounds of any desired voltage limits, such as the operating voltage range of the integrator 106. Furthermore, the pattern causes the switching errors associated with the reference voltage $-V_{REF}$ to be an offset in the integrator 106, rather than an effect on the gain of the integrator 106. More specifically, if one considers the switching transitions of the switches A and B, it is readily apparent that for each sequence of the four-step pattern each of the switches A and B connects ("1") and then disconnects ("0") the negative reference voltage $-V_{REF}$. Thus, a rising and falling transient is introduced by each switch. Hence, the foregoing transients substantially cancel each other with a slight offset. Worth noting is that the positive reference voltage $+V_{REF}$ is already a part of the offset of the integrator 106, because it is not switched at all.

Also worth noting is U.S. Pat. No. 4,951,053 to DesJardin, which is incorporated herein by reference. The DesJardin patent sets forth an improved integrating A/D converter for utilizing the four-step pattern disclosed in U.S. Pat. No. 4,357,600. Essentially, the improved circuit provides for reducing heat effects caused by the switches A and B. Also, the improved circuit stabilizes the reference voltages by way of switching currents, rather than voltages.

SUMMARY OF THE INVENTION

The present invention is a method and system for controlling the run-up (RU) interval of an integrating A/D converter. The A/D converter converts an analog input voltage into an integrator count, which is essentially a digitized version of the analog input voltage. The A/D converter has an integrator (such as a capacitor in parallel with an operational amplifier), a comparator connected to the integrator for determining voltage polarity changes, control logic for monitoring the output of the comparator, and a positive and a negative reference voltage $-V_{REF}$ which can be inputted along with the analog input voltage via control by the control logic.

The present invention suggests a four-step pattern which is repeated as many times as is required during the RU interval of the integrating A/D converter to accurately digitize the input voltage while maintaining the output of the integrator within a desired voltage range. The first step is to connect the positive reference voltage $+V_{REF}$ to the integrator. The second step is to decide whether to maintain the application of the positive reference voltage $+V_{REF}$ to the integrator or to change to the negative reference voltage $-V_{REF}$. The foregoing decision is determined such that the reference voltage which is applied causes the integrator output to be confined within a voltage range, for example, the operating voltage limits of the integrator. The third step is to either connect the negative reference voltage $-V_{REF}$ to the integrator or to maintain the application of the negative reference voltage $-V_{REF}$ to the integrator 106. The fourth step is to decide whether either to maintain the application of the negative reference voltage $-V_{REF}$ or to switch back to the positive reference voltage $+V_{REF}$. The foregoing decision is determined such that the reference voltage causes the integrator output to remain confined within the specified voltage range.

FEATURES AND ADVANTAGES OF THE INVENTION

The present invention overcomes the deficiencies of the prior art, as noted above, and further provides for the following additional features and advantages.

First, the present invention provides for the efficient and reliable control of the run-up (RU) interval of an integrating A/D converter. As a result of the control, an input voltage can be digitized with high resolution without exceeding the operating voltage range of the A/D convertor.

Second, in the present invention, the RU interval may be continuous, as in, for example, a sigma-delta A/D converter which is known in the convention.

Third, the amount of requisite logic for implementing the methodology of the present invention is much less than conventional embodiments.

Fourth, the present invention forces a constant number of transitions between the positive and negative reference voltage $-V_{REF}$s independent of the value of the voltage input. Therefore, any errors caused by transitions are the same for all input values. In other words, reference voltage switch errors are offsets, rather than elements of the A/D converter gain.

Fifth, the analog hardware to implement the present invention can be simple and inexpensive.

Further features and advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENT

Figure 7:
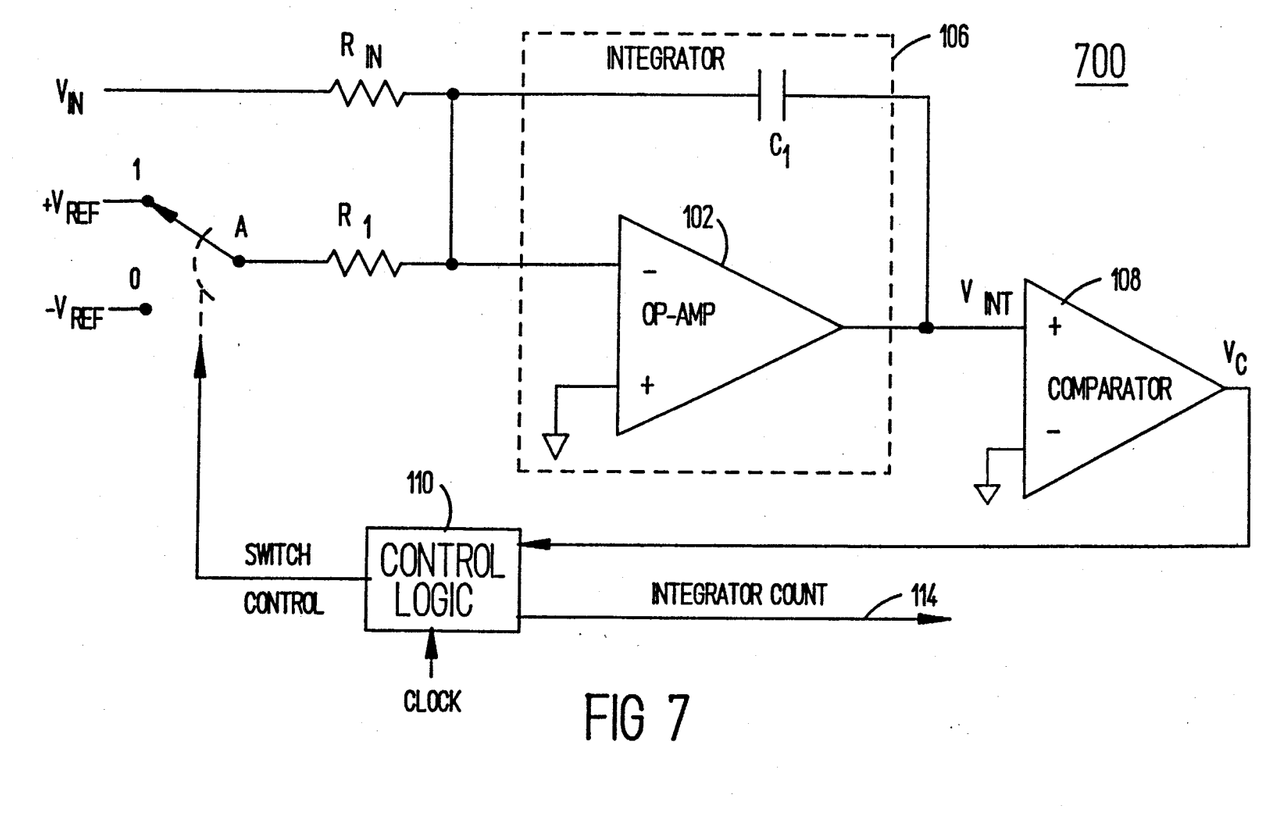
FIG. 7 illustrates a block diagram of the present invention.

With reference to FIG. 7, the present invention provides for the control of the run-up (RU) interval of an integrating A/D converter. The RU interval of an integrating A/D converter is when the voltage input $V_{IN}$ is connected to the A/D converter. As shown in FIG. 7, the voltage input $V_{IN}$ is inputted to the integrating A/D converter along with either a positive reference voltage $-V_{REF}$ or a negative reference voltage $-V_{REF}$. It should be noted that the voltage input $V_{IN}$ can be continuously applied. Furthermore, the reference signal could be any of a number of conventional means, for example, a voltage source or current source.

The foregoing inputted voltages are acted upon by an integrator 106. In the preferred embodiment, the integrator 106 is comprised of an operational amplifier (OP-AMP) 102 and a capacitor $C_1$. Other configurations of the integrator 106 could be employed.

The integrator output voltage $V_{INT}$ is fed to a comparator 108. The comparator 108 compares the integrator output voltage $V_{INT}$ to a comparator reference voltage, for example, ground, as in the preferred embodiment. The comparator output voltage $V_C$ is monitored by control logic 110. Further, the control logic 110 controls a switch A for alternately connecting either the positive reference voltage $+V_{REF}$ or the negative reference voltage $-V_{REF}$ to the integrating A/D converter. The control logic 110 further provides an integrator count on line 114, as shown, which in essence is the digitized manifestation (approximation) of the input voltage $V_{IN}$. It should be noted that the actual implementation of the circuit shown in FIG. 7 may take many forms, two of which appear in FIGS. 10 and 11 to be discussed later.

The present invention envisions operating the A/D converter disclosed in FIG. 7 in accordance with a four-step pattern indicated in Table B below. The four-step pattern may be repeated as is necessary during the run-up interval of the integrating A/D converter in order to keep the integrator output voltage $V_{INT}$ within any preselected voltage range, for example, the voltage limits of the OP-AMP 102.

TABLE B

| Step | State of Switch A | Origin of Switch State |
|------|-------------------|------------------------|
| 1    | 1                 | forced                 |
| 2    | 1(0)              | comparator driven      |
| 3    | 0                 | forced                 |
| 4    | 1(0)              | comparator driven      |

Figure 8:
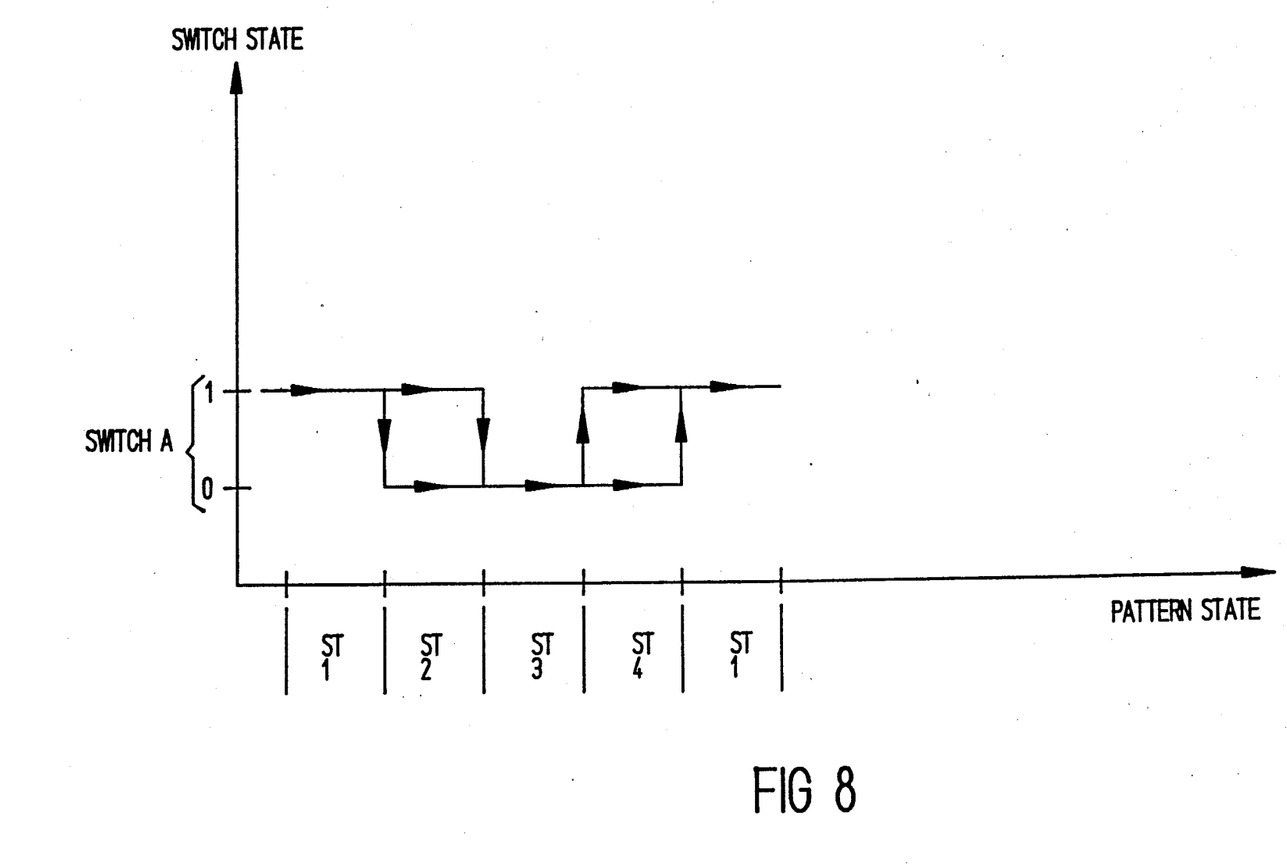
FIG. 8 is a plot of switch state as a function of pattern state in accordance with the present invention.

FIG. 8 is a plot of switch state versus pattern state in accordance with the present invention. Essentially, FIG. 8 is a graphical representation of the Table B above and which is set forth to aid in understanding the four-step pattern of the present invention. It is apparent from Table B and FIG. 8 that for each cycle of the four-step pattern, only two decisions are performed.

The first step is to connect the positive reference voltage $+V_{REF}$ to the integrator 106, as is shown in FIG. 7. In other words, the switch A is forced by the control logic 110 to apply the positive reference voltage $+V_{REF}$ to the A/D converter.

At step two, a decision must be made as to whether to maintain the application of the positive reference voltage $+V_{REF}$ to the integrator 106, or alternatively, to change over to the negative reference voltage $-V_{REF}$ (terminate application of $+V_{REF}$ and apply $-V_{REF}$). Changing over, if desired, is effectuated by toggling switch A. The decision is based upon the polarity of the integrator output voltage $V_{INT}$. If the integrator output voltage $V_{INT}$ is negative, then the comparator 108 will indicate this aspect to the control logic 110. Upon recognition of this scenario by the control logic 110, the control logic 110 will cause switch A to apply the negative reference voltage $-V_{REF}$, instead of the positive reference voltage $+V_{REF}$. However, if the integrator output voltage $V_{INT}$ is positive, as determined by the comparator 108, the control logic 110 will cause the switch A to maintain its connection to the positive reference voltage $+V_{REF}$.

The third step in accordance with the present invention is another switch state forced state, just as the first step. The negative reference voltage $-V_{REF}$ is connected to the integrator 106 or its application is maintained by the control logic 110. The third step is forced by the logic block 110 without regard to the output voltage $V_C$ of the comparator 108.

In the fourth step of the present invention, a decision is made as to whether to either maintain the application of the negative reference voltage $-V_{REF}$ or to switch back to the positive reference voltage $+V_{REF}$. The preceding determination is based upon the polarity of the integrator output voltage $V_{INT}$. If the integrator output voltage $V_{INT}$ is negative as determined by the comparator 108, the control logic 110 will cause the switch A to maintain the negative reference voltae $-V_{REF}$. However, if the integrator output voltage $V_{INT}$ is positive, as determined by the comparator 108, the control logic 110 will toggle the switch A so as to apply the positive reference voltage $+V_{REF}$ to the integrator 106.

It should be noted that the time duration for each of the four steps noted above can be equal or different depending on the requirements of the A/D converter.

Figure 9A:
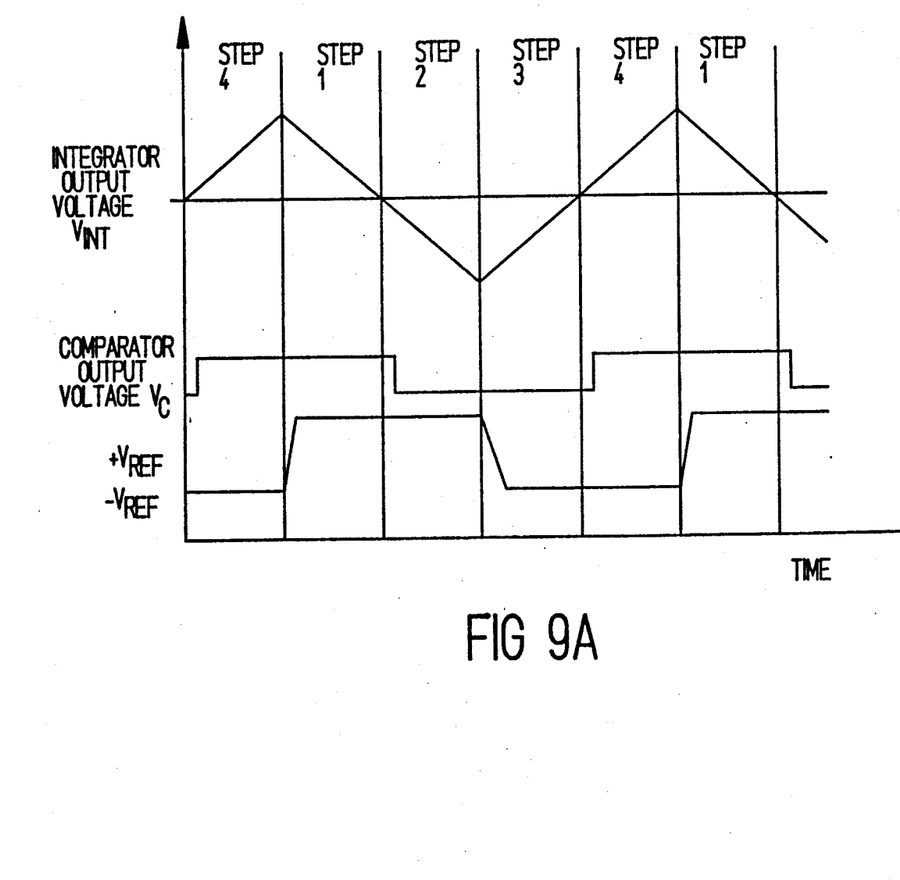
FIGS. 9(a)-9(d) illustrate plots of the integrator output voltage $V_{INT}$, the comparator output voltage $V_C$, the positive reference voltage $-V_{REF}$, and the negative reference voltage $-V_{REF}$ versus time for the block diagram of FIG. 7 in accordance with the four-step pattern of the present invention.
Figure 9B:
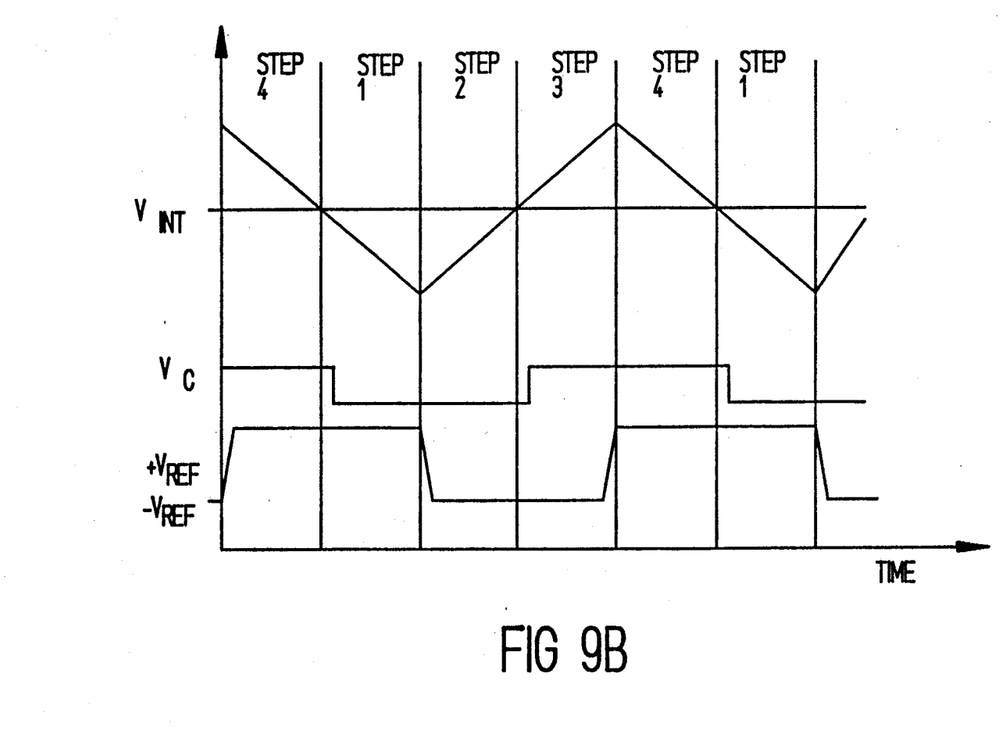
Figure 9C:
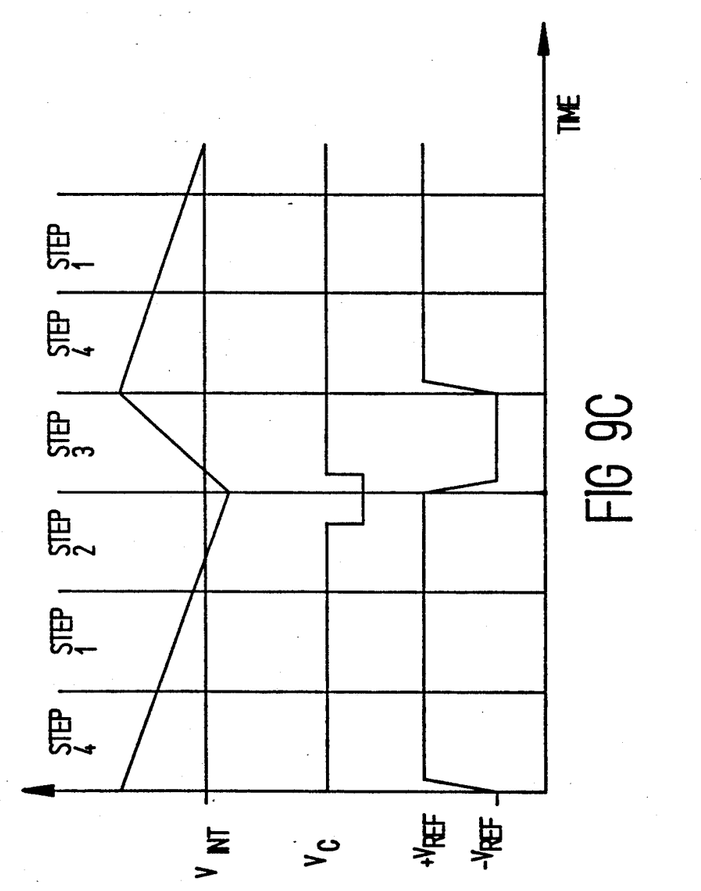
Figure 9D:
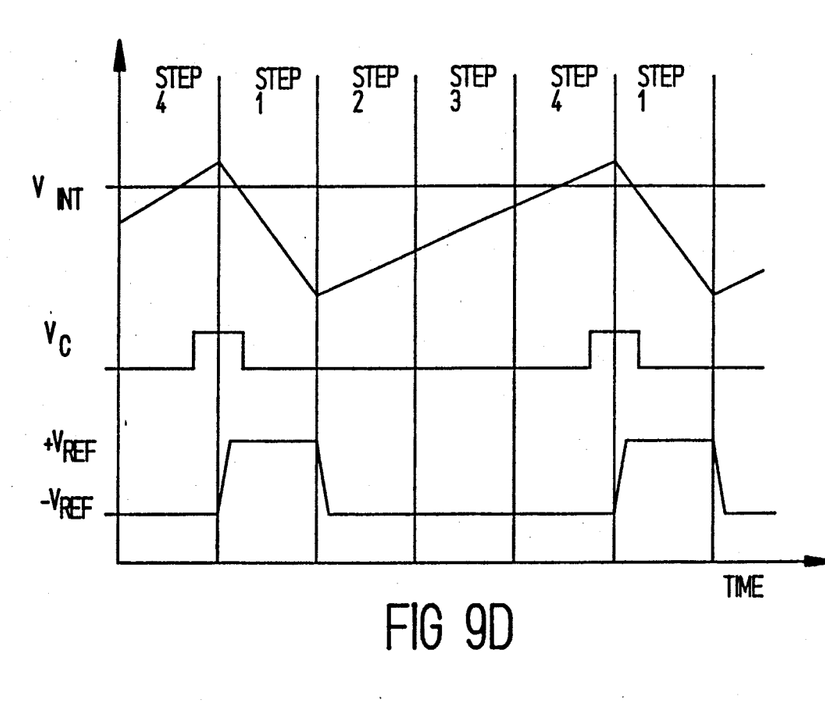

FIGS. 9(a)-9(d) show the response of various signals of FIG. 7 over time, in accordance with the present invention. The signals plotted in the FIGS. 9(a)-9(d) are the integrator output voltage $V_{INT}$, the comparator output voltage $V_C$, the applied reference voltages ($+V_{REF}$, $-V_{REF}$). The waveforms in FIGS. 9(a) and 9(b) are produced when the reference voltage connected in the second step and the fourth step are opposites. The waveform plotted in FIG. 9(c) is generated when the positive reference voltage $+V_{REF}$ is selected in both the second and fourth steps. Finally, the waveform plotted in FIG. 9(d) is produced when the negative reference voltage $-V_{REF}$ is selected in both the second and fourth steps of the novel four-step pattern.

Figure 10:
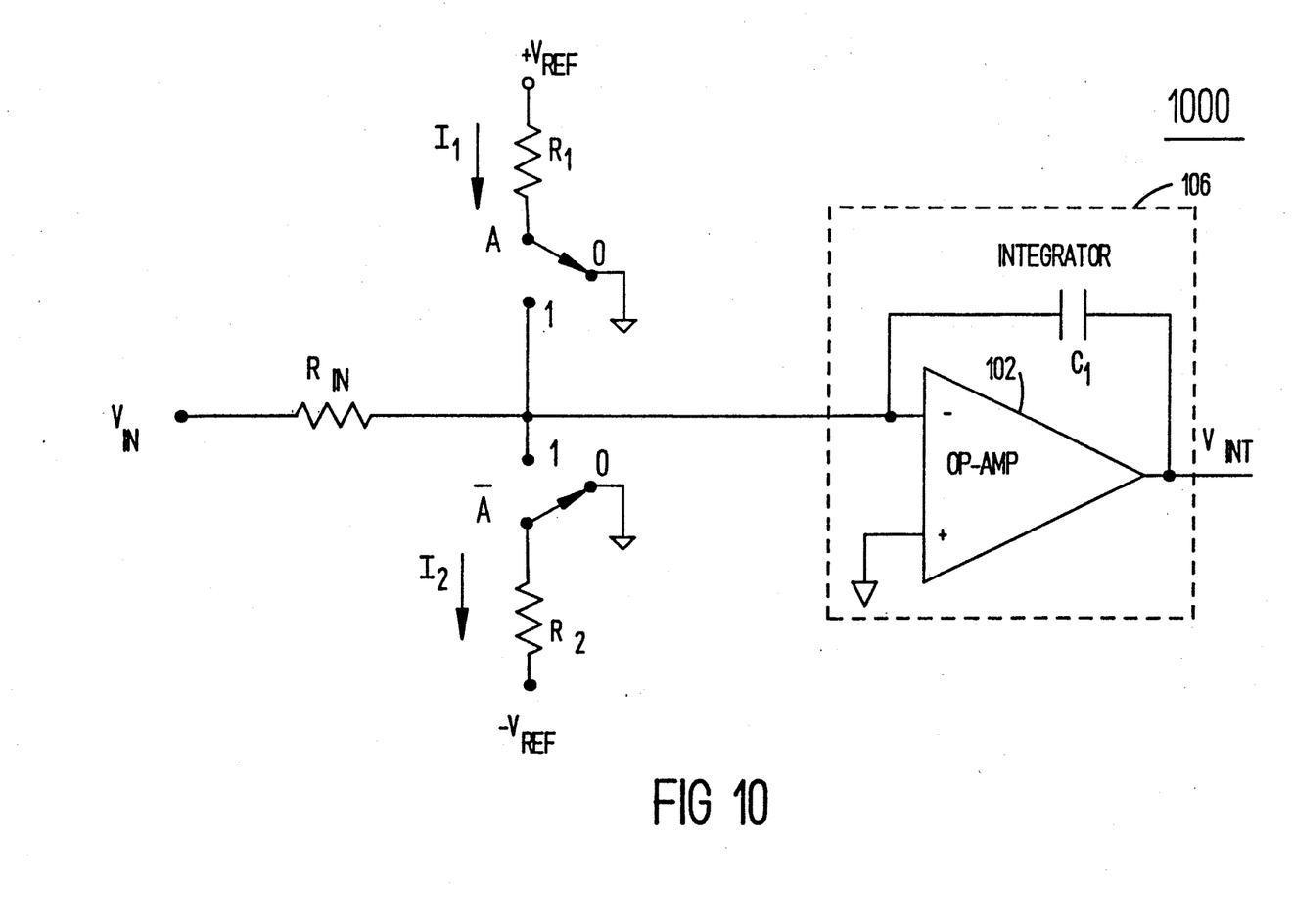
FIG. 10 is a specific implementation of FIG. 7, which can be operated in accordance with the four-step pattern of the present invention.

FIG. 10 shows a specific implementation of the A/D convertor as shown in FIG. 7. The four-step pattern in accordance with the present invention can easily be effectuated in FIG. 10. As shown, a switch A and a switch Ā (not A) are controlled by the control logic 110 in order to apply, respectively, the positive reference voltage $+V_{REF}$ and the negative reference voltage $-V_{REF}$. Thus, the positive reference voltage $+V_{REF}$ and the negative reference voltage $-V_{REF}$ are applied in an alternate fashion. Moreover, the magnitude of resistor $R_1$ is substantially equal to the magnitude of resistor $R_2$.

The specific implementation illustrated in FIG. 10 has several advantages. First, any adverse heat effects at the resistors $R_1$ and $R_2$ are eliminated because they are continuously conducting current independent of the switch condition. In other words, the power is constant regardless of the input signal. Moreover, the foregoing continuous conduction of current through the resistors $R_1$ and $R_2$ stabilizes the positive and negative reference voltage $-V_{REF}$s. In other words, current is switched, rather than voltage.

Figure 11:
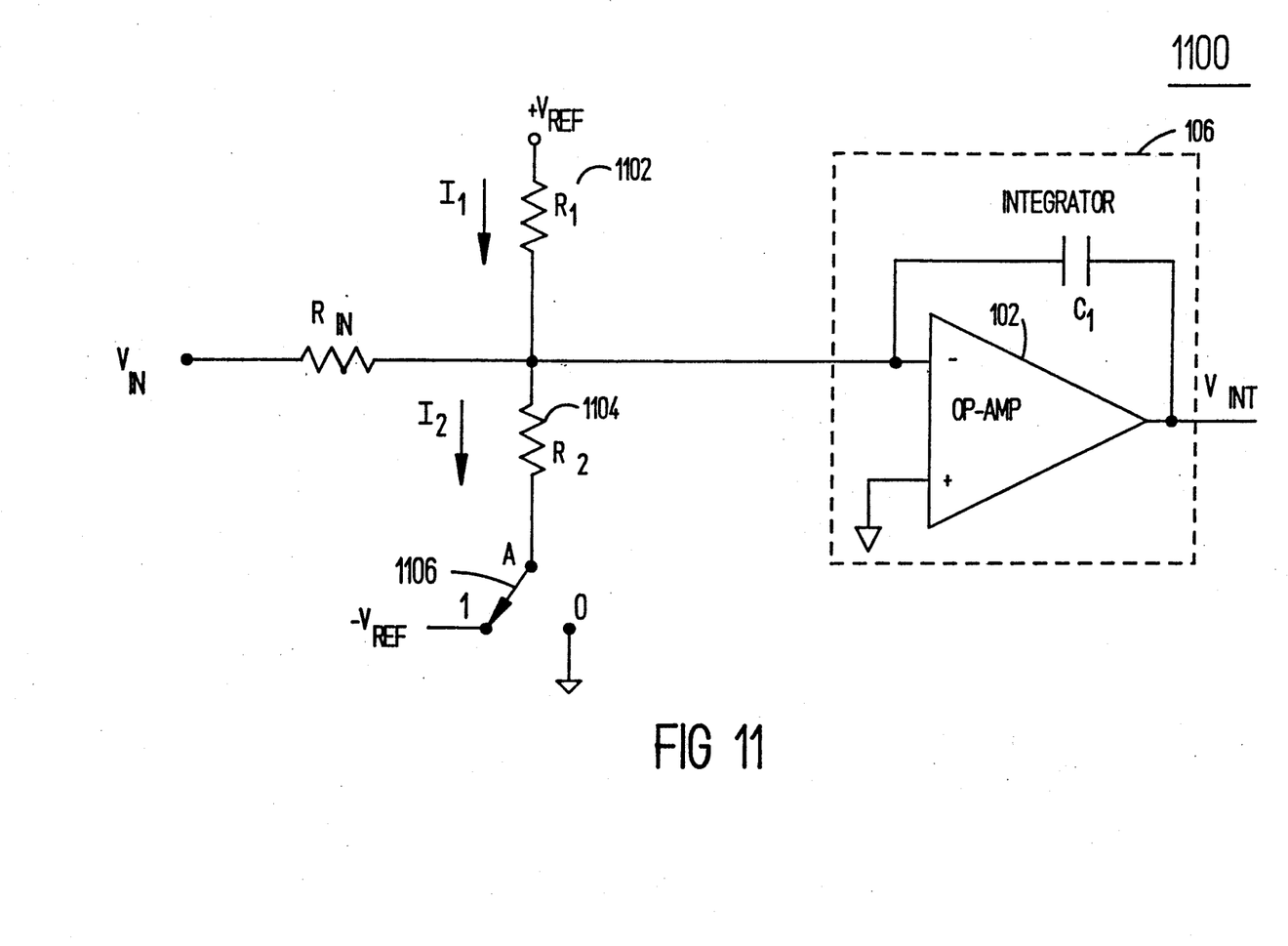
FIG. 11 illustrates another specific implementation of FIG. 7, which can be used to implement the four-step pattern in accordance with the present invention wherein only a negative reference voltage $-V_{REF}$ is switched.

FIG. 11 illustrates another specific implementation of the A/D converter set forth in FIG. 7. As shown in FIG. 11, the positive reference voltage $+V_{REF}$ is continuously applied to the integrator 106, while the negative reference voltage $-V_{REF}$ is selectively applied via a switch A. The magnitude of resistor $R_2$ equals one half (50%) of the magnitude of resistor $R_1$. Accordingly, when the switch A is connected ("1") to the negative reference voltage $-V_{REF}$, as shown, the current $I_2 = -2*I_1$. In the foregoing scenario, the negative reference voltage $-V_{REF}$, not $+V_{REF}$, is effectively applied to the integrator 106 along with the input voltage $V_{IN}$.

Conversely, when the switch A is connected to ground ("0"), the positive reference voltage $+V_{REF}$, not $-V_{REF}$, is effectively applied to the integrator 106 along with the input voltage $V_{IN}$.

The specific implementation as set forth in FIG. 11 has advantages. Only one logic signal need be generated by the control logic 110 in order to control and operate the single switch A. Further, only one of the reference voltages is switched and can effect the gain of the integrator 106. Finally, in general, the specific implementation of FIG. 11 requires a minimum of hardware. Only a single switch, two resistors, and a little control logic need be implemented to practice the present invention.

The foregoing description of the preferred embodiment of the present invention has been presented for purposes of illustration and description. It is not intended to be exhaustive or to limit the present invention to the precise forms disclosed, and obviously many modifications and variations are possible in light of the above teachings. The particular embodiments were chosen and described in order to best explain the principles of the present invention and its practical application to those skilled in the art, and to thereby enable those persons skilled in the art to best utilize the present invention in various embodiments and with various modifications as are suited to the particular use contemplated. It is intended that scope of the present invention be broadly defined by the claims appended hereafter.

The following is claimed:

1. A method for controlling the run-up (RU) interval of an integrated A/D converter, comprising the steps of:
   (a) applying an analog signal to an integrator;
   (b) applying a positive reference charge to said integrator regardless of the integrated charge within said integrator;
   (c) maintaining the application of said positive reference charge to said integrator when the integrated charge within said integrator is negative, or alternatively, applying a negative reference charge to said integrator when the integrated charge within said integrator is positive;

(d) maintaining said negative reference charge, or alternatively, applying said negative reference charge to said integrator regardless of the integrated charge within said integrator; and (e) maintaining the application of said negative reference charge to said integrator when the integrated charge within said integrator is positive, or alternatively, applying a positive reference charge to said integrator when the integrated charge within said integrator is negative.

2. The method of claim 1, further comprising the step of generating a positive and a negative reference charge by a current source.

3. The method of claim 1, wherein steps (b) through (e) are repeated during the RU interval of the integrating A/D converter in order to keep the output voltage of said integrator within a preselected voltage range.

4. The method of claim 1, wherein steps (b) through (e) each have a different operational time duration.

5. The method of claim 1, wherein step (a) is continuously applied.

6. A method for controlling the run-up (RU) interval of an integrated A/D converter, comprising the steps of:

(a) applying an analog input signal to an integrator;

(b) applying a positive reference charge to said integrator regardless of the integrated charge within said integrator;

(c) determining the polarity of the integrated charge within said integrator;

(d) terminating the application of said positive reference charge and applying a negative reference charge if said polarity is positive, or alternatively, continuing to apply said positive reference charge if said polarity is negative;

(e) applying said negative reference charge to said integrator regardless of the integrated charge within said integrator;

(f) determining the polarity of the integrated charge within said integrator; and (g) terminating the application of said negative reference charge and applying said positive reference charge if said polarity is negative, or alternatively, continuing to apply said negative reference charge if said polarity is positive.

7. The method of claim 5, further comprising the step of generating a positive and a negative reference charge by a current source.

8. The method of claim 6, wherein steps (b) through (g) are repeated during the RU interval of the integrating A/D converter in order to keep the output voltage of said integrator within a preselected voltage range.

9. The method of claim 6, wherein steps (b) through (g) each have a different operational time duration.

10. The method of claim 6, wherein step (a) is continuously applied.

11. A system for controlling the run-up (RU) interval of an integrating A/D converter, comprising:

(1) an integrator having an input and an output, said input connected to an analog input voltage and further connected to one of a positive and a negative reference charge, wherein said further connection is switchably controlled to be connected to one of said reference charges;

(2) a comparator having an input connected to said output of said integrator for determining voltage polarity changes;

(3) control logic means for monitoring the output of the comparator and for switching the application of said positive and negative reference charges, said control logic means for implementing a pattern during the RU interval of said A/D converter, said pattern having the steps of (a) applying an analog signal to said integrator; (b) applying said positive reference charge to said integrator regardless of the integrated charge within said integrator; (c) maintaining the application of said positive reference charge to said integrator when the integrated charge within said integrator is negative, or alternatively, applying said negative reference charge to said integrator when the integrated charge within said integrator is positive; (d) applying said negative reference charge to said integrator regardless of the integrated charge within said integrator; and (e) maintaining the application of said negative reference charge to said integrator when the integrated charge within said integrator is positive, or alternatively, applying said positive reference charge to said integrator when the integrated charge within said integrator is negative.

12. A system for controlling the run-up (RU) interval of an integrating A/D converter, comprising:

(1) an integrator having an input and an output, said input connected to an analog input voltage and further connected to a positive and a negative reference charge, wherein said further connection comprises,
 a first resistance connecting said positive reference charge to said integrator; and
 a second resistance connecting said negative reference charge to said integrator by control of a switch, said second resistance equal to approximately one half of said first resistance;

(2) a comparator having an input connected to said output of said integrator for determining voltage polarity changes; and (3) control logic means for monitoring the output of the comparator and for switching the application of said positive and negative reference charges, said control logic means for implementing a pattern during the RU interval of said A/D converter, said pattern having the steps of (a) applying an analog signal to said integrator; (b) applying said positive reference charge to said integrator regardless of the integrated charge within said integrator; (c) maintaining the application of said positive reference charge to said integrator when the integrated charge within said integrator is negative, or alternatively, applying said negative reference charge to said integrator when the integrated charge within said integrator is positive; (d) applying said negative reference charge to said integrator regardless of the integrated charge within said integrator; and (e) maintaining the application of said negative reference charge to said integrator when the integrated charge within said integrator is positive, or alternatively, applying said positive reference charge to said integrator when the integrated charge within said integrator is negative.

* * * * *